(12) United States Patent
Tabuchi

(10) Patent No.: US 8,809,197 B2
(45) Date of Patent: Aug. 19, 2014

(54) PLASMA ETCHING APPARATUS AND CONTROL METHOD

(71) Applicant: Tokyo Electron Limited, Tokyo (JP)

(72) Inventor: Atsuhiko Tabuchi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/013,128

(22) Filed: Aug. 29, 2013

(65) Prior Publication Data

US 2014/0073066 A1 Mar. 13, 2014

Related U.S. Application Data

(60) Provisional application No. 61/698,878, filed on Sep. 10, 2012.

(30) Foreign Application Priority Data

Aug. 29, 2012 (JP) ................................. 2012-188913

(51) Int. Cl.
*H01L 21/302* (2006.01)
(52) U.S. Cl.
USPC ............................ 438/710; 438/714; 438/715
(58) Field of Classification Search
USPC ................ 438/5, 14, 706, 709, 710, 714, 715
See application file for complete search history.

(56) References Cited

U.S. PATENT DOCUMENTS

| | | | |
|---|---|---|---|
| 2005/0014380 A1* | 1/2005 | Kai et al. | 438/706 |
| 2006/0087793 A1* | 4/2006 | Kim et al. | 361/234 |
| 2011/0220288 A1 | 9/2011 | Kobayashi et al. | |
| 2012/0238040 A1* | 9/2012 | Kubota et al. | 438/5 |

FOREIGN PATENT DOCUMENTS

| | | |
|---|---|---|
| JP | 6-283594 A | 10/1994 |
| JP | 2011-187758 A | 9/2011 |

* cited by examiner

*Primary Examiner* — Kevin M Picardat
(74) *Attorney, Agent, or Firm* — Rothwell, Figg, Ernst & Manbeck, P.C.

(57) ABSTRACT

In a control method, a first processing is performed on an object to be processed by controlling a temperature of a base to a first temperature and controlling a temperature of an electrostatic chuck that is disposed on a mounting surface of the base so as to mount thereon the object to be processed and has a heater installed therein to a second temperature. A second processing is performed on the object by controlling a temperature of the base to a third temperature and controlling a temperature of the electrostatic chuck to a fourth temperature by a heater. In the control method, a difference between the first temperature and the second temperature and a difference between the third temperature and the fourth temperature are within a tolerable temperature of the junction layer for bonding the base and the electrostatic chuck.

16 Claims, 11 Drawing Sheets

FIG.4

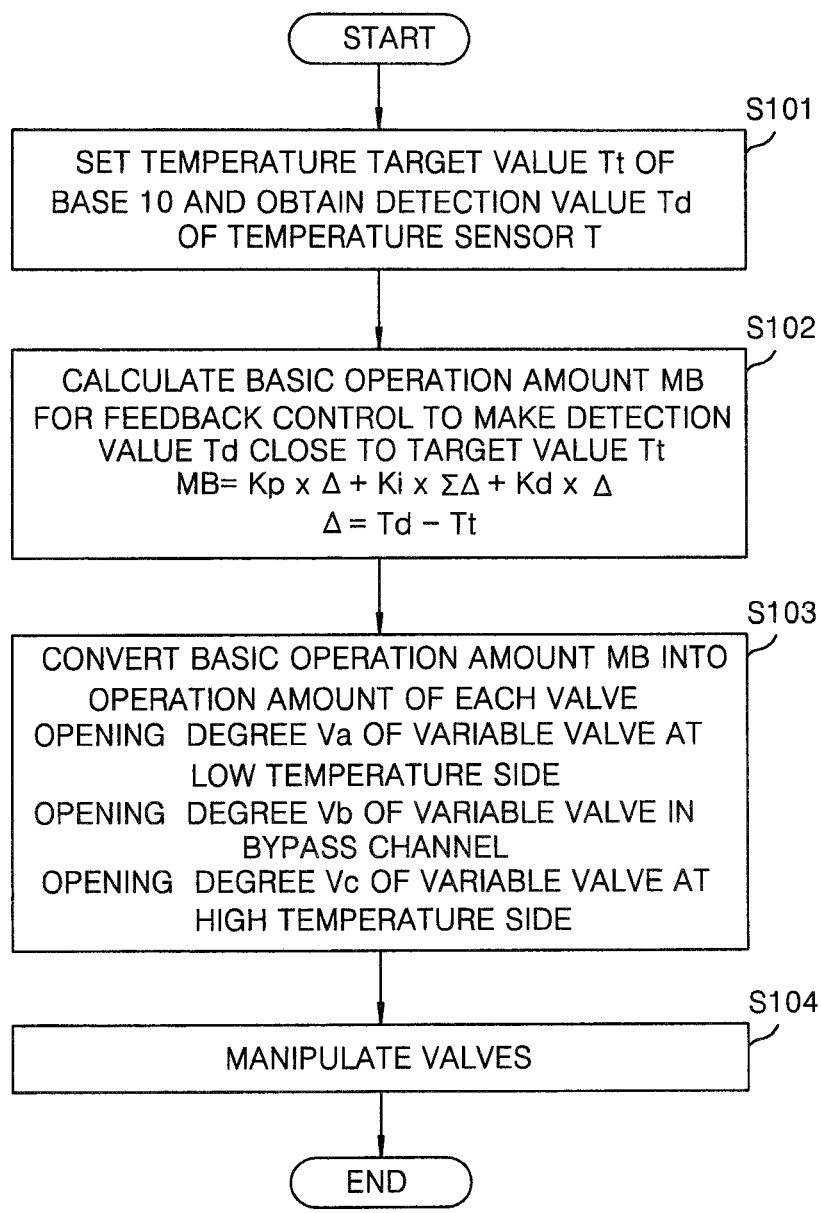

START

S101 — SET TEMPERATURE TARGET VALUE Tt OF BASE 10 AND OBTAIN DETECTION VALUE Td OF TEMPERATURE SENSOR T

S102 — CALCULATE BASIC OPERATION AMOUNT MB FOR FEEDBACK CONTROL TO MAKE DETECTION VALUE Td CLOSE TO TARGET VALUE Tt
$MB = K_p \times \Delta + K_i \times \Sigma\Delta + K_d \times \Delta$
$\Delta = Td - Tt$ S103 — CONVERT BASIC OPERATION AMOUNT MB INTO OPERATION AMOUNT OF EACH VALVE
OPENING DEGREE Va OF VARIABLE VALVE AT LOW TEMPERATURE SIDE
OPENING DEGREE Vb OF VARIABLE VALVE IN BYPASS CHANNEL
OPENING DEGREE Vc OF VARIABLE VALVE AT HIGH TEMPERATURE SIDE

S104 — MANIPULATE VALVES

END

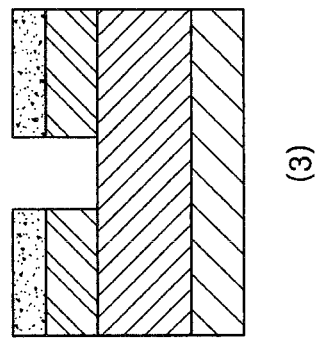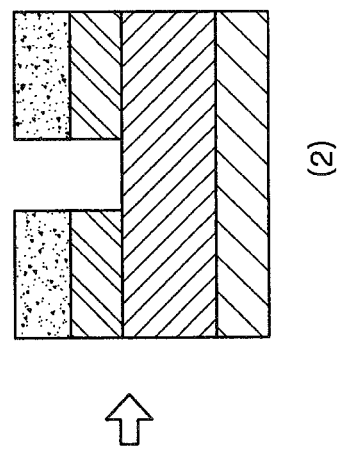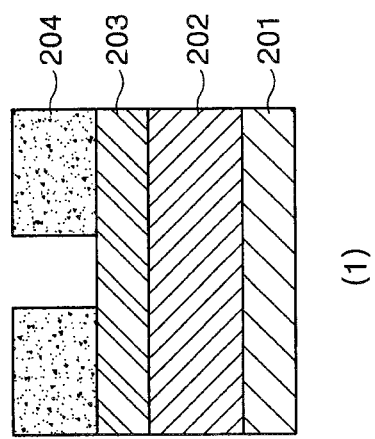

PLASMA ETCHING APPARATUS AND CONTROL METHOD

CROSS-REFERENCE TO RELATED APPLICATIONS

This application claims priority to Japanese Patent Application Nos. 2012-188913 and 2013-031212, respectively filed on Aug. 29, 2012 and Feb. 20, 2013, and U.S. Provisional Application No. 61/698,878 filed on Sep. 10, 2012, the entire contents of which are incorporated herein by reference.

FIELD OF THE INVENTION

Various aspects and embodiments of the present invention relate to a plasma etching apparatus and a control method.

BACKGROUND OF THE INVENTION

Conventionally, a plasma etching apparatus includes, between a base (susceptor) and an electrostatic chuck, a junction layer for bonding the base and the electrostatic chuck. An elastic body extended by an amount equal to or greater than a thermal expansion/contraction difference between the base and the electrostatic chuck is used for the junction layer. Further, the plasma etching apparatus includes a temperature control system for controlling a temperature to a predetermined level by simultaneously performing cooling of the base by a chiller and heating of the electrostatic chuck by a heater installed in the electrostatic chuck (see, e.g., Japanese Patent Application Publication Nos. H6-283594 and 2011-187758).

However, the above technique has a problem in which the junction layer is peeled off. For example, the junction layer may be peeled off when the temperature difference between the base and the electrostatic chuck exceeds the tolerable temperature of the junction layer by increasing the temperature of the electrostatic chuck by performing heating using the heater.

SUMMARY OF THE INVENTION

A control method of an embodiment disclosed herein includes: a first processing step of controlling a temperature of a base to a first temperature, controlling a temperature of an electrostatic chuck that is disposed on a mounting surface of the base so as to mount thereon an object to be processed and has a heater installed therein to a second temperature, and performing first processing on the object. The control method further includes a second processing step of controlling a temperature of the base to a third temperature, controlling a temperature of the electrostatic chuck to a fourth temperature by a heater, and performing second processing on the object. In the control method, a difference between the first temperature and the second temperature and a difference between the third temperature and the fourth temperature are within a tolerable temperature of the junction layer for bonding the base and the electrostatic chuck.

BRIEF DESCRIPTION OF THE DRAWINGS

FIG. 4 is a flowchart showing an example of a processing sequence of feedback control performed by a process controlled in the first embodiment.

FIGS. 7A to 7C show an example of an etching process performed by the process controller in the first embodiment.

DETAILED DESCRIPTION OF THE EMBODIMENTS

Figure 1:
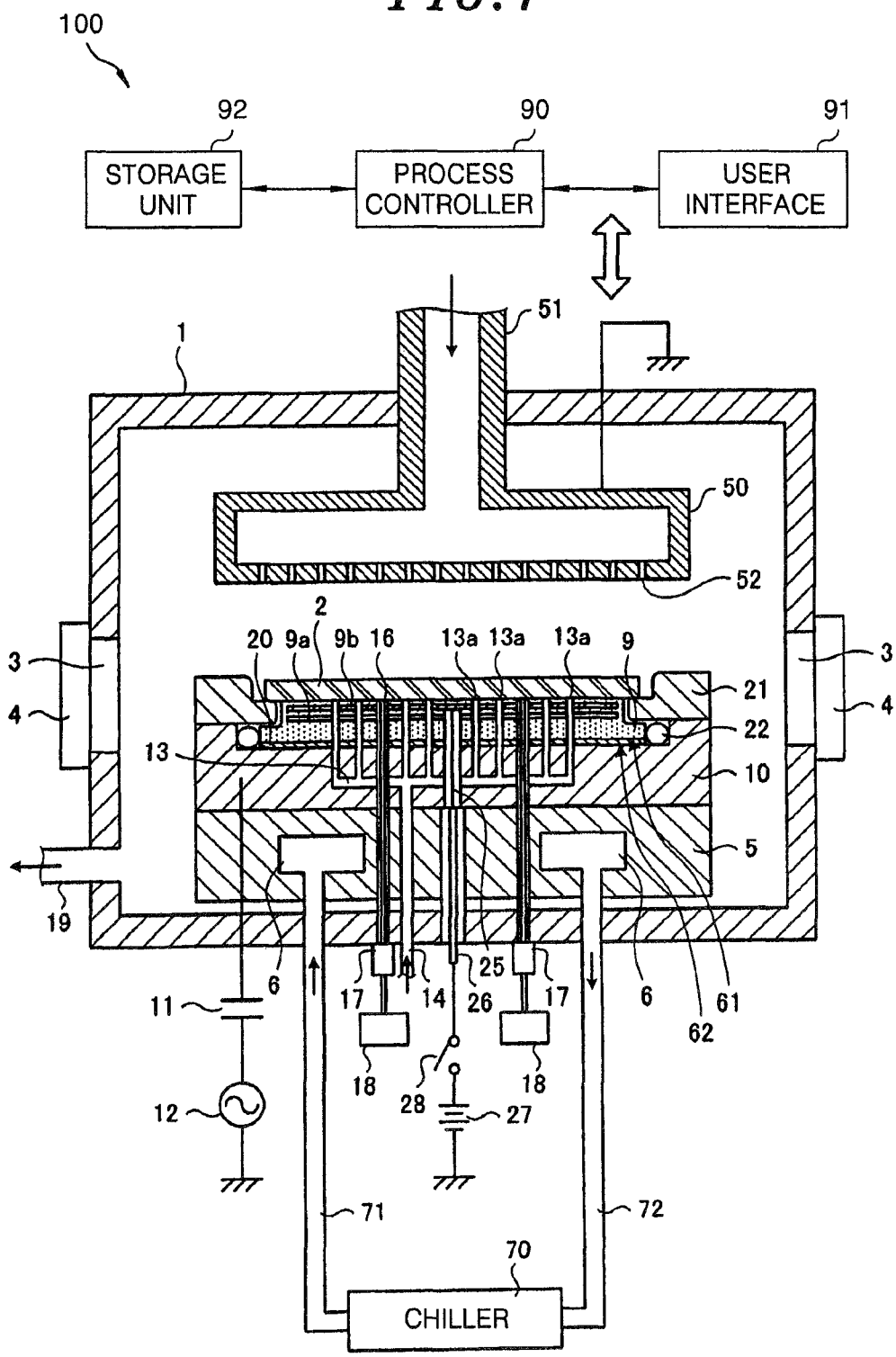
FIG. 1 is a cross sectional view showing an entire plasma etching apparatus in accordance with a first embodiment of the present invention.

Hereinafter, embodiments of a plasma etching apparatus and a control method will be described in detail with reference to the accompanying drawings. The present invention is not limited to such embodiments. The embodiments may be properly combined within the scope of not contradicting the processing content.

First Embodiment

A control method in accordance with a first embodiment includes a first processing step of controlling a temperature of a base to a first temperature, controlling a temperature of an electrostatic chuck that is disposed on a mounting surface of the base so as to mount thereon an object to be processed and has a heater installed therein to a second temperature, and performing first processing on the object. The control method of the first embodiment further includes a second processing step of controlling a temperature of the base to a third temperature, controlling a temperature of the electrostatic chuck to a fourth temperature by a heater, and performing second processing on the object. In the control method of the first embodiment, a difference between the first temperature and the second temperature and a difference between the third temperature and the fourth temperature are within a tolerable temperature of the junction layer for bonding the base and the electrostatic chuck.

The control method of the first embodiment further includes, after the first processing step, a changing step of changing, when a difference between the first temperature and the fourth temperature exceeds the tolerable temperature of the junction layer, the first temperature to the third temperature so that the temperature difference with respect to the fourth temperature becomes within the tolerable temperature range of the junction layer.

In the control method of the first embodiment, a cooling medium circulates in a flow path disposed in the base by a chiller, and the temperature of the base is controlled by controlling the temperature of the cooling medium.

A plasma etching apparatus in accordance with the first embodiment includes: a base; an electrostatic chuck disposed on a mounting surface of the base and configured to mount thereon an object to be processed; a junction layer bonding the base and the electrostatic chuck; a heater provided in the electrostatic chuck; and a chiller configured to control a temperature of the base. The plasma etching apparatus of the first embodiment further includes a control unit configured to control, when first processing is performed on the object, a temperature of the base to a first temperature and a temperature of the electrostatic chuck to a second temperature, and control, when second processing is performed on the object, a temperature of the base to a third temperature and a temperature of the electrostatic chuck to a fourth temperature by the heater. A temperature difference between the first temperature and the second temperature and a temperature difference between the third temperature and the fourth temperature are within a tolerable temperature of the junction layer.

(Configuration of the Plasma Etching Apparatus in Accordance with the First Embodiment)

As shown in FIG. 1, a plasma etching apparatus 100 includes a chamber 1. The chamber 1 has an outer wall made of a conductive aluminum. In the example shown in FIG. 1, the chamber 1 has an opening 3 for loading and unloading a semiconductor wafer 2 into and from the chamber 1, and a gate valve 4 that can be opened and closed by a seal member for airtight sealing. The seal member is, e.g., an O-ring.

Although it is not shown in FIG. 1, a load-lock chamber is connected to the chamber 1 via a gate valve 4. A transfer unit is provided in the load-lock chamber. The transfer unit loads or unloads a semiconductor wafer 2 into or from the chamber 1.

Moreover, the chamber 1 has, at a bottom portion of a sidewall, a discharge port 19 for decreasing a pressure in the chamber 1. The discharge port 19 is connected to a vacuum exhaust unit (not shown) via an opening/closing valve, e.g., a butterfly valve or the like. The vacuum exhaust unit is, e.g., a rotary pump, a turbo molecular pump or the like.

Figure 2:
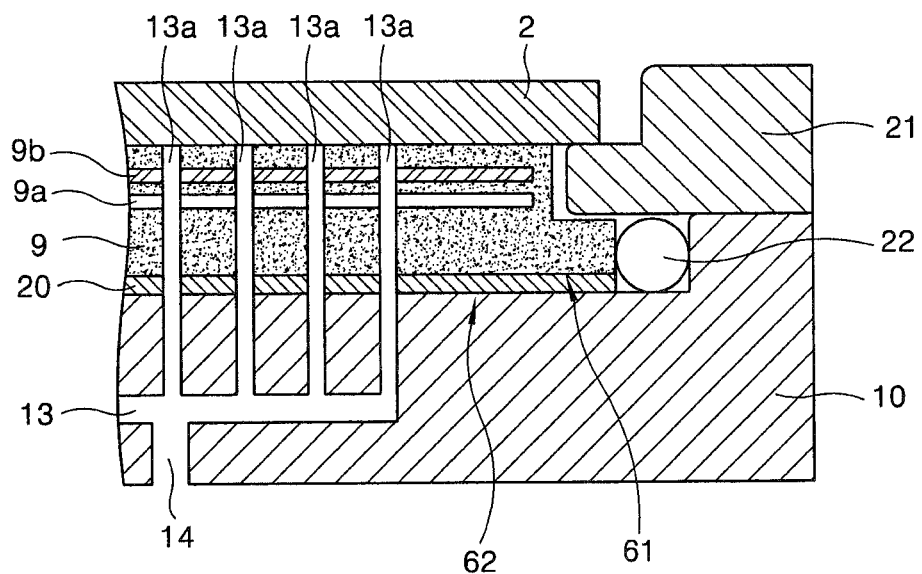
FIG. 2 is a cross sectional view showing positional relationship between a semiconductor wafer, an electrostatic chuck, a base, a focus ring and a seal member in the first embodiment.

As shown in FIG. 1, the plasma etching apparatus 100 includes a base supporting table 5 provided at a central portion of a bottom surface in the chamber 1. The plasma etching apparatus 100 includes a base 10 provided on the base supporting table 5. As shown in FIGS. 1 and 2, the plasma etching apparatus 100 includes an electrostatic chuck 9 provided on the base 10. Moreover, the plasma etching apparatus includes a focus ring 21 disposed on the base 10 so as to surround the electrostatic chuck 9. In the example shown in FIG. 1, the base supporting table 5 and the base 10 are separately illustrated. However, the base supporting table 5 and the base 10 may be together referred to as a base.

Further, as shown in FIGS. 1 and 2, the base 10 has a portion whose height is higher than that of a portion where the electrostatic chuck 9 is installed. Hereinafter, the portion whose height is higher compared to the portion where the electrostatic chuck 9 is installed is referred to as "peripheral block portion." Further, as shown in FIG. 2, the plasma etching apparatus 100 includes a seal member 22 that is brought into contact with at least two among the side surface of the electrostatic chuck 9, the peripheral block portion of the base 10 and the surface of the base 10 where the electrostatic chuck 9 is installed. The seal member 22 is, e.g., an O-ring.

Moreover, the plasma etching apparatus 100 includes an upper electrode 50 provided at an upper portion of the chamber 1 so as to be positioned above the base 10. The upper electrode 50 is electrically grounded. A processing gas is supplied to the upper electrode 50 via a gas supply line 51 and injected toward the semiconductor wafer 2 through a plurality of small pores 52 radially formed in a bottom wall of the upper electrode 50. Here, by switching a high frequency power supply 12 to ON, a plasma of the injected processing gas is generated between the upper electrode 50 and the semiconductor wafer 2. Further, the processing gas is, e.g., $CHF_3$, $CF_4$ or the like.

Here, each unit of the plasma etching apparatus 100 will be described further. The base supporting table 5 is a cylindrical conductive member made of aluminum or the like. The base supporting table 5 has therein a coolant jacket 6 for retaining a cooling medium to the inside. A flow path 71 for introducing a cooling medium into the coolant jacket 6 and a flow path 72 for discharging the cooling medium are provided at the coolant jacket 6 while airtightly penetrating through the bottom surface of the chamber 1.

FIG. 1 shows the example in which the coolant jacket 6 is provided inside the base supporting table 5. However, the present invention is not limited thereto. For example, the coolant jacket 6 may be provided inside the base 10. As will be described later, the coolant jacket 6 controls the temperature of the base 10 or the base supporting table 5 by circulation of the cooling medium by the chiller 70.

The base 10 provided on the base supporting table 10 is made of a conductive material, e.g., aluminum or the like (coefficient of linear thermal expansion of Al: approximately about $23.5 \times 10^{-6}$ (cm/cm/° C.)), and serves as a lower electrode. The base 10 is attached to the base supporting table 5 by a bolt (not shown). The base 10 is cooled by conduction of cold heat of the coolant jacket 6 via the base supporting table 5. The base 10 is connected to a high frequency power supply 12 via a blocking capacitor 11. The high frequency power supply 12 has a frequency of, e.g., 13.56 MHz, 40 MHz or the like.

As shown in FIGS. 1 and 2, the base 10 and the electrostatic chuck 9 are bonded by the junction layer 20. The junction layer 20 is, e.g., RTV rubber (room temperature curing silicone rubber). The base 10 and the electrostatic chuck 9 are bonded to each other by uniformly coating silicone rubber on at least one of a joint surface 62 of the base 10 and a joint surface 61 of the electrostatic chuck 9 at, e.g., a room temperature, forming the junction layer 20, and then bringing the other joint surface into contact with the junction layer 20.

The electrostatic chuck 9 is made of, e.g., ceramic (coefficient of linear thermal expansion: approximately about $7.1 \times 10^{-6}$ (cm/cm/° C.)). The electrostatic chuck 9 has therein an electrode plate 9b and a heater 9a. The electrostatic chuck 9 made of ceramic and the base 10 made of metal have different thermal expansion coefficient.

The semiconductor wafer 2 is mounted on the top surface of the electrostatic chuck 9.

As shown in FIG. 1, the electrode plate 9b is connected to one end of a conductive line 25, and the other end of the conductive line 25 is connected to a power supply rod 26. A periphery of the conductive line 25 is covered by an insulating member, e.g., Teflon (Registered Trademark), which is installed inside the base 10. The power supply rod 26 is made of, e.g., copper, and supplies a high voltage of about 200V to 3 KV. Further, the power supply rod 26 airtightly penetrates through the bottom surface of the chamber 1 in an insulated state and is connected to a high voltage power supply 27 via an electromagnetic switch 28. Further, the electromagnetic switch 28 is switched between ON and OFF by a control signal for controlling an apparatus (not shown).

Further, through holes 16 are formed in the base 10, the base supporting table 5, the junction layer 20 and the electrostatic chuck 9. Provided inside the through holes 16 are pusher pins 15 grounded via an electrical resistance or an inductance. The pusher pins 15 are connected to an air cylinder 18 serving as a vertically moving unit via a bellows 17 capable of extending and contracting while airtightly sealing the chamber 1. Moreover, the pusher pins 15 receive and deliver the semiconductor wafer W with respect to the transfer unit of the load-lock chamber and are moved vertically by the air cylinder 18 to move the semiconductor wafer 2 toward and away from the electrostatic chuck 9.

A plurality of through holes 13$a$ for uniformly supplying a heat transfer medium to a backside of the semiconductor wafer W is formed in the base 10 and the electrostatic chuck 9. The through holes 13$a$ are connected to a gas storage chamber 13 for uniforming a pressure of He gas which is applied to the through holes 13$a$. The gas storage chamber 13 is connected to a supply line 14 for introducing the heat transfer medium from the outside of the chamber 1. The heat transfer medium is, e.g., He gas as an inert gas. However, the heat transfer medium is not limited thereto, and may also be any gas.

In addition, the plasma etching apparatus 100 includes a chiller 70 for circulating a cooling medium in the coolant jacket 6, as shown in FIG. 1. Specifically, the chiller 70 sends the cooling medium through the flow path 71 to the coolant jacket 6 and receives the cooling medium discharged from the coolant jacket 6 through the flow path 72.

(Chiller)

Figure 3:
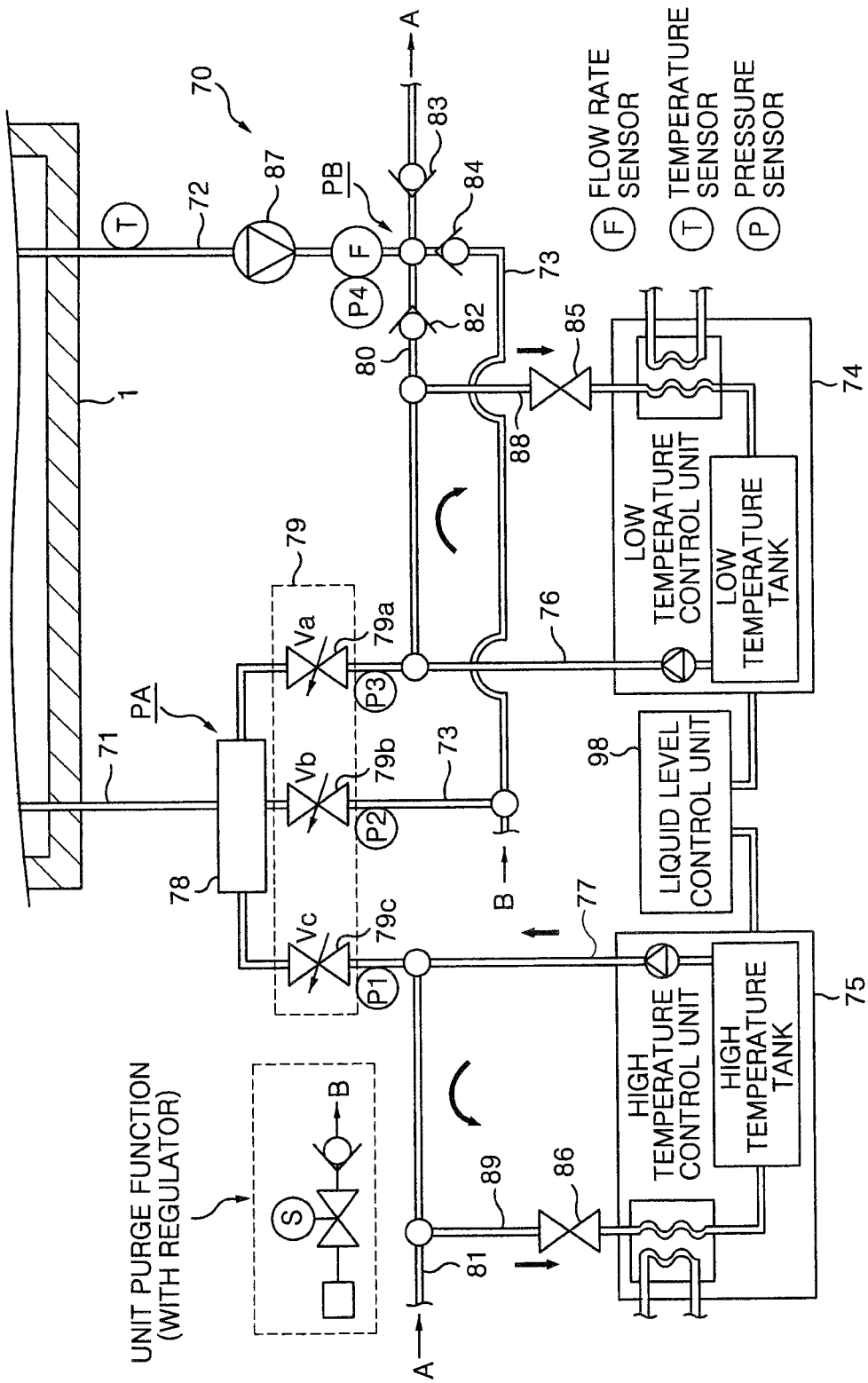
FIG. 3 shows an example of a structure of a chiller in the first embodiment.

FIG. 3 shows an example of a structure of the chiller in the first embodiment. Hereinafter, the chiller 70 will be described. The chiller 70 has two heat storage circulation circuits formed by a low temperature control unit 74 and a high temperature control unit 75. The two circulation circuits have large-sized tanks capable of storing the cooling medium and circulation pumps, and the amount of the cooling medium stored in each tank may satisfy a predetermined amount enough to constantly ensure stability of a temperature. Therefore, the temperature control performance of the chiller 70 can be maintained, and the temperature control can be stably carried out.

The low temperature control unit 74 stores, in a low temperature tank, liquid whose temperature has been controlled to a first temperature by a heat exchanger of the low temperature control unit 74. The high temperature control unit 75 stores, in a high temperature tank, liquid whose temperature has been controlled to a second temperature higher than the first temperature by a heat exchanger of the high temperature control unit 75. The first temperature and the second temperature are controlled by a process controller 90 to be described later. The low temperature cooling medium stored in the low temperature control unit 74 reaches a junction part PA through a low temperature channel 76 and joins a bypass channel 73 for circulating the cooling medium. The high temperature cooling medium stored in the high temperature control unit also reaches the junction part PA through a high temperature channel 77 and joins the bypass channel 73 for circulating the cooling medium. The junction part PA has a temporary tank 78 for mixing the cooling mediums flowing through the low temperature channel 76, the high temperature channel 77 and the bypass channel 73, so that the cooling mediums flowing therein are temporarily mixed. Here, the cooling mediums that have been mixed and made to flow in the flow path 71 become the cooling medium that circulates in the coolant jacket 6. The flow path 71 joins, at the junction part PA, the low temperature channel 76, the high temperature channel 77 and the bypass channel 73. The cooling medium mixed in the tank 78 temporarily flows in the flow path 71. By using the pre-mixed cooling medium for a cooling medium flowing in the flow path 71, the temperature of the cooling medium flowing in the coolant jacket 6 becomes stable, which can improve the temperature controllability.

Here, the low temperature control unit 74 retains the cooling medium of, e.g., about −10° C. The high temperature control unit 75 retains a cooling medium of, e.g., about 10° C. to 50° C., in the high temperature tank. However, the present invention is not limited thereto. Specifically, the low temperature control unit 74 may retain the cooling medium of any temperature lower than that of the cooling medium retained by the high temperature control unit 75. Further, the high temperature control unit 75 may retain the cooling medium of any temperature higher than that of the cooling medium retained by the low temperature control unit 74.

Moreover, the low temperature control unit 74 retains a cooling medium of, e.g., about −15° C. to −5° C. and preferably a cooling medium of about −10° C. By maintaining the temperature of the cooling medium of, e.g., about −10° C., the temperature of the cooling medium to be supplied to the coolant jacket 6 can be quickly changed while avoiding condensation.

As described above, the chiller 70 circulates the cooling medium in the coolant jacket 6 by sending the cooling medium to the flow path 71 formed in the base 10, receiving the cooling medium from the flow path 72, controlling the temperature of the cooling medium, and then sending the cooling medium to the flow path 71. The temperature of the base 10 is controlled by circulating the cooling medium in the coolant jacket 6 by the chiller 70.

The flow paths 71 and 72 form circulation paths branched at a branch portion PB into the low temperature channel 80, the high temperature channel 81 and the bypass channel 73, and the cooling medium flowing through the cooling jacket 6 is circulated through the circulation paths. The temperature of the base 10 is controlled by controlling the temperature of the cooling medium circulating through the circulation paths.

In the chiller 71 of the present embodiment, the cooling mediums flowing in the high temperature channel 77 and the low temperature channel 76 are directly introduced into and discharged from the circulation lines through the junction portion PA.

A valve unit 79 is provided at an upstream side of the junction portion PA and includes variable valves 79$a$ to 79$c$. The variable valves 79$a$ to 79$c$ are respectively attached to the low temperature channel 76, the bypass channel 73, and the high temperature channel 77. By changing opening degrees Va to Vc of the variable valves 79$a$ to 79$c$, the sum of the flow rates from the respective channels is controlled.

The low temperature channel 80, the high temperature channel 81 and the bypass channel 73 which are branched from the branch portion PB are provided with check valves 82 to 84, respectively, so that the cooling medium branched at the branch portion PB into three directions is prevented from flowing backward toward the branch portion PB. The cooling medium flowing in the low temperature channel 80 returns to the low temperature control unit 74 and is subjected to temperature control in the low temperature control unit 74. The valve 85 is provided at a line 88 connected to the low temperature channel 80 and adjusts the amount of the cooling medium returning to the low temperature control unit 74 through the low temperature channel 80 and the line 88.

In the same manner, the cooling medium flowing in the high temperature channel 81 (connected from a right side to a left side as indicated by the arrows A in the drawing) returns to the high temperature control unit 75 and is subjected to temperature control in the high temperature control unit 75.

The valve 86 is provided at a line 89 connected to the high temperature channel 81 and adjusts the amount of the cooling medium returning to the high temperature control unit 75 through the high temperature channel 81 and the line 89.

The process controller 90 adjusts the number of rotation of an inverter of a pump 87 attached to the flow path 72 and controls a flow rate of a cooling medium introduced into the coolant jacket 6. Further, the process controller 90 controls pressures in three channels 76, 73 and 77 for supplying the cooling medium by controlling the valve unit 79. As a result, the flow rate in the circulation line including the cooling jacket 6 is maintained at a constant level, and the cooling medium from the branch portion PB circulates through in the bypass channel 73 or returns to the low temperature control unit 74 and the high temperature control unit 75. In this manner, the storage amounts of the low temperature control unit 74 and the high temperature control unit 75 can become the same. Further, a flow meter F and a pressure gauge P4 which are attached to a line near the branch portion PB and pressure gauges P1 to P3 attached to lines near the valve unit 79 are used for flow rate control and pressure control.

The low temperature channel 80, the high temperature channel 81, and the bypass channel 73 are provided with the check valves 82 to 84, respectively. However, the liquid level difference between the high temperature control unit 75 and the low temperature control unit 74 may occur due to errors in the pressure control or the flow of the cooling medium toward the high temperature channel at the timing of supplying the cooling medium from the low temperature control unit 74, for example.

Even in that case, the liquid level difference does not occur by the action of a liquid level control tank 98 that is provided near the low temperature control unit 74 and the high temperature control unit 75 so as to communicate with the tanks in the respective units. In other words, the three tanks spontaneously have the same liquid level height.

Here, when the temperature of the base 10 is increased, the amount of the cooling medium discharged from the high temperature control unit 75 becomes greater than the amount of the cooling medium discharged from the low temperature control unit 74, and the liquid level of the high temperature control unit 75 becomes lower than the liquid level of the low temperature control unit 74. On the contrary, when the temperature of the base 10 is decreased, the liquid level of the low temperature control unit 74 becomes lower than the liquid level of the high temperature control unit 75. In that case, the cooling medium stored in the liquid level control tank 98 flows to the tank having a lower liquid level between two tanks, so that the liquid level spontaneously becomes the same. Moreover, the liquid level control tank 98 has a liquid level gauge (not shown) and detects abnormality by detecting the liquid level in the liquid level control tank 98.

As described above, in the chiller 70 of the first embodiment, dual cooling mediums are provided. The temperatures of the low temperature cooling medium and the high temperature cooling medium are managed, and the cooling mediums are supplied to the coolant jacket 6 while being mixed at a predetermined flow rate ratio. The low temperature channel and the high temperature channel are not closed systems but open systems that join at the junction portion PA. In the system in which the low temperature channel and the high temperature channel are configured as closed systems, the supply amount of the cooling medium that has been heated or cooled during the temperature control becomes insufficient and the temperature controllability deteriorates. Particularly, the maximum amount of the cooling medium that is supplied after being heated is limited, so that the supply amount of the cooling medium heated to a high temperature is exhausted within first a few seconds, which deteriorates the heating performance.

To that end, in accordance with the chiller 70 of the first embodiment, the tank in the low temperature control unit 73 and the tank in the high temperature unit 75 for use in cooling and heating are provided to supply a large amount of cooling medium, so that the cooling medium in the tanks can be constantly supplied without being exhausted. Accordingly, the temperature control can be stably performed at a high speed.

Further, the chiller 70 has a unit purge function used for returning the cooling medium to each tank by supplying air into a line as indicated by the arrows B in the drawing, for example. Moreover, the chiller 70 may be entirely or partially installed in the plasma etching apparatus 100, or may be entirely or partially installed to the outside of the plasma etching apparatus 100. For example, the low temperature control unit 74 and the high temperature control unit 75 are large-sized and may be provided at positions remote from the chamber 1 in consideration of the arrangement space for the gas exhaust unit or the like which needs to be installed around the plasma etching apparatus 100. Furthermore, the configurations shown in FIG. 3, for example, may be attached to the outside of the plasma etching apparatus 100 or may be installed inside the plasma etching apparatus 100.

(Control Unit in the First Embodiment)

The respective components of the plasma etching apparatus 100 are connected to and controlled by a process controller 90 having a CPU. The process controller 90 is connected to a user interface 91 having a keyboard through which a process manager performs a command input to manage the plasma etching apparatus 100, a display for visually displaying the operational state of the plasma etching apparatus 100, and the like.

Further, the process controller 90 is connected to a storage unit 92 that stores therein recipes such as processing condition data and control programs to be used in realizing various processes performed by the plasma etching apparatus 100 under the control of the process controller 90.

Further, a certain recipe is retrieved from the storage unit 92 under an instruction from the user interface and executed by the process controller 90, so that a desired process is performed in the plasma etching apparatus 100 under the control of the process controller 90. The recipes may be stored in a computer-readable storage medium, e.g., a CD-ROM, a hard disk, a flexible disk, a flash memory or the like, or may be transmitted on-line from another device via, e.g., a dedicated transmission line.

The process controller 90 may also be referred to as "control unit". Further, the function of the process controller 90 may be realized by using a software or may be realized by using a hardware.

For example, the process controller 90 controls the temperature of the base 10 or the base supporting table 5 by performing feedback control.

Further, the process controller 90 controls the temperatures of the base 10 and the electrostatic chuck 9 by controlling the temperatures of the heater 9a and the chiller 70. In other words, the process controller 90 controls the temperature of the semiconductor wafer 2 by the heater 9a provided in the electrostatic chuck 9 and thermal cooling of heat by the coolant jacket 6. At this time, as will be described later, when the object is subjected to first processing, the process controller 90 controls the temperature of the base 10 to a first temperature and the temperature of the electrostatic chuck 9 to a second temperature by the heater 9a. Further, when the object is subjected to second processing, the process controller 90 controls the temperature of the base 10 to a third temperature and the temperature of the electrostatic chuck 9 to a fourth temperature by the heater 9a. Moreover, the process controller 90 performs control such that the difference between the first temperature and the second temperature and the difference between the third temperature and the fourth temperature fall within the tolerable temperature of the junction layer 20. For example, the process controller 90 controls the heater 9a provided inside the electrostatic chuck 9 and the coolant jacket 6 during the plasma etching process.

(Feedback Control)

Hereinafter, an example of feedback control performed by the process controller 90 will be briefly described.

The process controller 90 feedback-controls the opening/closing of the variable valves 79a to 79c while monitoring the temperature sensor T and the pressure sensors P1 to P3. The process controller 90 feedback-controls the variable valves 79a to 79c such that the temperature detected by the temperature sensor T becomes close to the set temperature of the base 10.

The temperature sensor T measures the temperature of the cooling medium discharged from the base 10. In other words, the temperature sensor T measures the temperature of the cooling medium discharged from the outlet of the flow path of the coolant jacket 6.

In general, when the temperature of the base 10 is not considerably changed, the process controller 90 allows the cooling medium to flow in the circulation path (the bypass channel 73→the flow path 71→the coolant jacket 6→the flow path 72→the bypass channel 73), decreases the flow rates of the cooling mediums supplied from the tanks 74 and 75, and circulates the cooling mediums with energy efficiency. Meanwhile, when the heating is required, the process controller 90 introduces the high temperature cooling medium by increasing the opening degree Vc of the valve body of the variable valve 79c of the high temperature channel 77, and increases the temperature of the cooling medium flowing in the flow path 71. When the cooling is required, the process controller 90 introduces the low temperature cooling medium by increasing the opening degree Va of the valve body of the variable valve 79a of the low temperature channel 76, and decreases the temperature of the cooling medium flowing in the flow path 71.

In order to increase the temperature, the process controller 90 controls the opening degrees Va to Vc of the variable valves 79a to 79c such that the amount of the liquid introduced from the high temperature channel 77 into the flow path 71 becomes greater than the amount of the liquid introduced from the low temperature channel 76 and the bypass channel 73 into the flow path 71. Further, in order to decrease the temperature, the process controller 90 controls the opening degrees Va to Vc of the variable valves 79a to 79c such that the amount of the liquid introduced from the low temperature channel 76 into the flow path 71 becomes greater than the amount of the liquid introduced from the high temperature channel 77 and the bypass channel 73 into the flow path 71.

Figure 5:
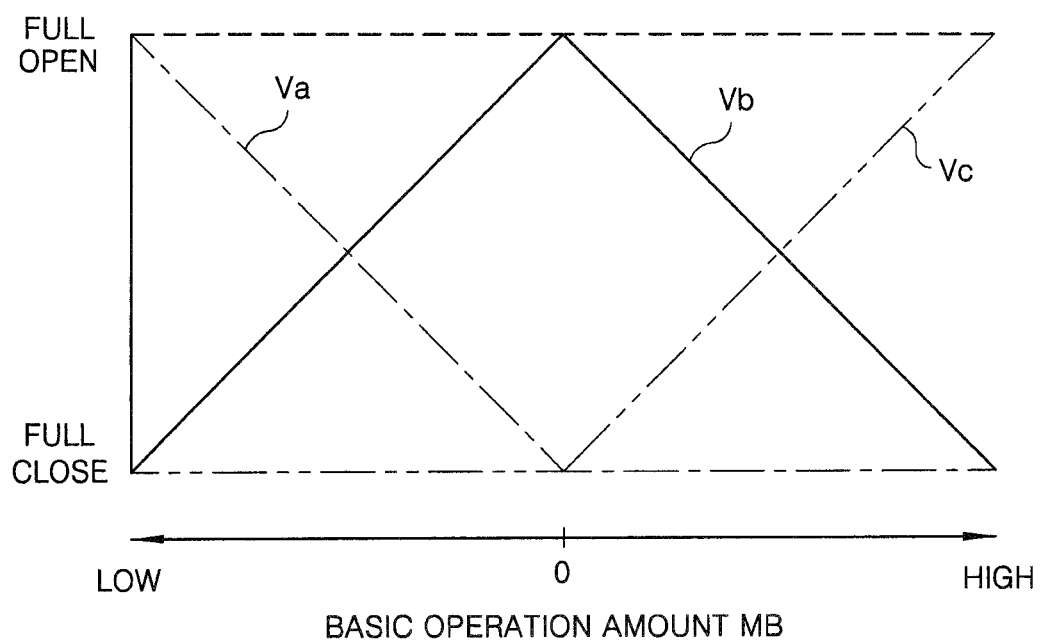
FIG. 5 shows an example of operation amounts of variable valves in the first embodiment.

The feedback control by the process controller 90 will be described with reference to FIGS. 4 and 5. FIG. 4 is a flowchart showing an example of a processing sequence of feedback control performed by the process controller in the first embodiment. FIG. 5 shows an example of operation amounts of the variable valves in the first embodiment. The processing shown in FIG. 4 is repeatedly performed by the process controller 90 at a predetermined cycle, for example.

When the processing is started, the process controller 90 sets a target value Tt of the temperature of the base 10 and obtains a detection value Td of the temperature sensor T as a temperature of a cooling medium joined at the junction portion PA (step S101).

Further, the process controller 90 feedback-controls the opening degrees Va to Vc of the variable valves 79a to 79c based on the detection value Td to make the detection value Td close to the target value Tt. Accordingly, the process controller 90 calculates a basic operation amount MB for feedback control (step S102).

The basic operation amount MB is the amount calculated based on the difference between the target value Tt and the detection value Td. Specifically, in the present embodiment, the basic operation amount MB is calculated by a PID (proportional-integrate-derivative) operation of a difference $\Delta$ between the detection value Td and the target value Tt.

Moreover, the process controller 90 converts the basic operation amount MB into the operation amounts of the variable valve 79a of the low temperature side, the variable valve 79b of the bypass channel and the variable valve 79c of the high temperature side, i.e., into the opening degrees Va to Vc of the variable valves 79a to 79c (step S103). Here, the relationship between the valve opening degrees Va to Vd of the variable valves shown in FIG. 5 is used.

Here, when the basic operation amount MB is smaller than zero, the valve opening degree Va of the variable valve 79a is monotonically decreased as the basic operation amount MB is increased. When the basic operation amount MB is greater than or equal to zero, the valve opening degree Va of the variable valve 79a becomes "0". This is the setting for increasing the flow rate in the low temperature channel 76 as the detection value Td is increased greater than the target value Tt and preventing the low temperature channel 76 from being used when the detection value Td is smaller than or equal to the target value Tt. Further, when the basic operation amount MB is greater than zero, the valve opening degree Vc of the variable valve 79c is monotonically increased as the basic operation amount MB is increased. When the basic operation amount MB is smaller than or equal to zero, the valve opening degree Vc of the variable valve 79c becomes "0". This is the setting for increasing the flow rate in the high temperature channel 77 as the detection value Td is decreased smaller than the target value Tt and preventing the high temperature channel 77 from being used when the detection value Td is greater than or equal to the target value Tt. Further, the valve opening degree Vb of the variable valve 79b is monotonically decreased as the basic operation amount MB becomes away from zero. In FIG. 5, it is preferable to set the valve opening degrees Va to Vc such that the sum of the flow rates from the three channels is not changed depending on the basic operation amount MB.

In accordance with the above setting, the operation amounts of the three variable valves 79a to 79c are set based on the basic operation amount MB calculated by the single PID operation of the difference D between the detection value Td and the target value Tt.

Thereafter, the process controller 90 manipulates the opening degrees Va to Vc of the valve main body of the variable valves 79a to 79c (step S104), thereby completing the process.

As a result of the feedback control, the detected value Td can follow the target value Tt with high accuracy.

(Temperature Control Process Performed by the Process Controller in the First Embodiment)

Figure 6:
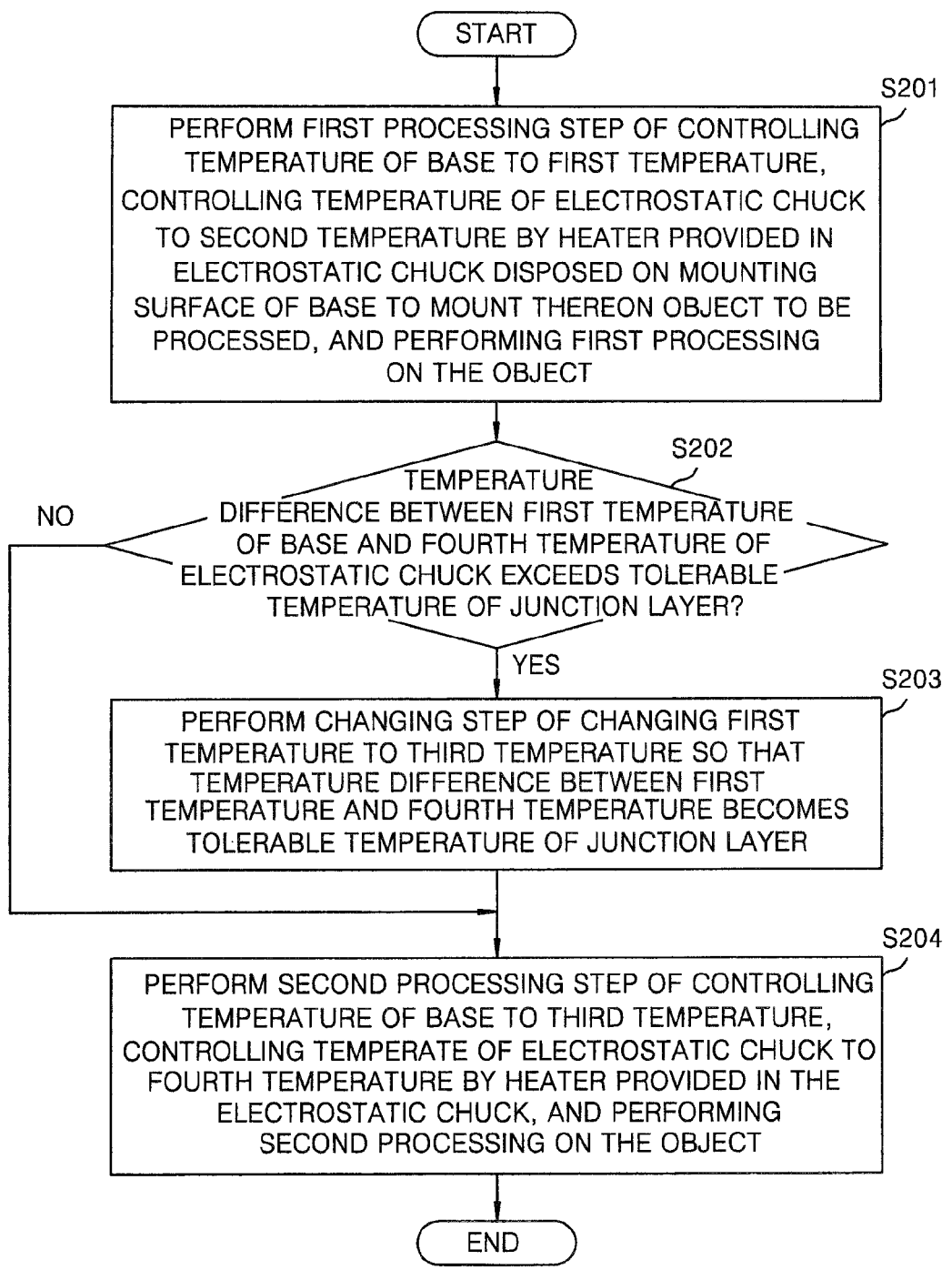
FIG. 6 is a flowchart showing an example of a sequence of a temperature control process performed by the process controller in the first embodiment.

FIG. 6 is a flowchart showing an example of a sequence of a temperature control process performed by the process controller in the first embodiment. A series of processes shown in FIG. 6 is executed by the process controller 90 when an instruction for etching, for example, is received from a user.

Hereinafter, the case in which the tolerable temperature of the junction layer 20 is "70° C." will be described. However, the tolerable temperature is not limited thereto, and may also be any temperature. The tolerable temperature of the junction layer 20 indicates a tolerable temperature difference between the temperature of the electrostatic chuck 9 provided on the junction layer 20 and the temperature of the base 10 provided below the junction layer 20. In general, a substance is expanded when the temperature is increased and contracted when the temperature is decreased. Here, if the temperature difference between the electrostatic chuck 9 and the base 10 exceeds the tolerable temperature of the junction layer 20, the junction layer 20 may be peeled off from the joint surface 61 or 62.

When the temperature control processing by the process controller 90 is described with reference to FIG. 6, it is assumed that an etching process is performed by the process controller 90. FIGS. 7A to 7C show an example of the etching process performed by the process controller in the first embodiment.

In other words, the case in which the process controller 90 loads the semiconductor wafer 2 into the chamber 1 and performs plasma etching thereon as shown in FIGS. 7A to 7C will be described as an example. As shown in FIG. 7A, a silicon oxide film 202, an anti-reflection film 203, and a photoresist 204 are laminated on the semiconductor wafer 201.

Referring back to FIG. 6, the process controller 90 performs a first processing step of controlling the temperature of the base 10 to the first temperature, controlling the temperature of the electrostatic chuck 9 to the second temperature by the heater 9a provided inside the electrostatic chuck 9 that is disposed on the mounting surface of the base 10 so as to mount thereon the object to be processed, and performing first processing on the object (step S201).

For example, the process controller 90 sets the temperature of the semiconductor wafer 2 to "0° C.". More specifically, the process controller 90 controls the temperature of the semiconductor wafer 2 to "0° C." by controlling the temperature of the base 10 to "0° C." (first temperature) by the cooling of the cooling medium of the chiller 70 without heating the heater 9a. Further, the process controller 90 performs etching by introducing $CF_4$ gas as a processing gas while setting the pressure of the chamber 1 to 6.67 Pa and a lower high frequency power to 40 MHz/13.56 MHz=1000 W/100 W.

At this time, the process controller 90 performs the etching after the temperature of the semiconductor wafer 2 is decreased compared to that in the second processing step, so that the shape of the anti-reflection film 203 can be maintained. At this time, the photoresist 204 is also etched. FIG. 7B shows an example of the semiconductor wafer 2 that has been subjected to the first processing step.

Further, the process controller 90 determines whether or not the temperature difference between the first temperature of the base 10 and the fourth temperature of the electrostatic chuck 9 by the heater 9a exceeds the tolerable temperature of the junction layer 20 (step S202). In other words, the temperature difference between the temperature of the base 10 in the first processing step and the temperature of the electrostatic chuck 9 in the second processing step exceeds the tolerable temperature of the junction layer 20. For example, the case in which the tolerable temperature is set to "70° C." will be described.

Here, when the temperature difference between the first temperature and the fourth temperature exceeds the tolerable temperature of the junction layer 20 (step 202: YES), the process controller 90 performs, after the first processing step, a changing step of changing the first temperature to the third temperature so that the temperature difference between the third temperature and the fourth temperature becomes the tolerable temperature of the junction layer 20 (step S203). For example, when the fourth temperature of the electrostatic chuck 9 by the heater 9a is, e.g., "80° C.", the first temperature of the base 10 is "0° C." and, thus, the temperature difference between the first temperature of the base 10 and the fourth temperature of the electrostatic chuck 9 by the heater 9a becomes "80° C.", which exceeds the tolerable temperature "70° C.".

At this time, the process controller 90 changes the first temperature that is the temperature of the base 10 to "10° C.", so that the temperature difference can fall within the tolerable temperature "70° C." of the junction layer 20 even when the fourth temperature of the electrostatic chuck 9 is "80° C.".

More specifically, the process controller 90 increases the temperature of the base 10 to "10° C." (third temperature) by increasing the temperature of the cooling medium supplied by the chiller 70.

Further, the process controller performs the second processing step of controlling the third temperature of the base 10 to "10° C.", controlling the temperate of the electrostatic chuck to the fourth temperature "80° C." by the heater 9a provided in the electrostatic chuck 9, and performing the second processing on the object (step S204). Here, the difference between the first temperature and the second temperature and the difference between the third temperature and the fourth temperature fall within the tolerable temperature "70° C." of the junction layer 20 for bonding the base 10 and the electrostatic chuck 9. FIG. 7C shows an example of the semiconductor wafer 2 that has been subjected to the second processing step.

For example, the process controller 90 controls the temperature of the semiconductor wafer 2 to "80° C.". More specifically, the process controller 90 controls the temperature of the semiconductor wafer 2 to "80° C." by controlling the temperature of the electrostatic chuck 9 to "80° C." by heating the heater 9a. Further, the process controller 90 performs etching by introducing $C_4F_6/Ar/O_2$ gas as a processing gas while setting the pressure of the chamber 1 to 2.67 Pa and a lower high frequency power to 40 MHz/13.56 MHz=1600 W/800 W.

When the difference between the first temperature of the base 10 and the fourth temperature of the electrostatic chuck 9 by the heater 9a does not exceed the tolerable temperature "70° C." of the junction layer 20 in the step S202 (step S202: NO) the process controller 90 may perform the second processing step without changing the temperature of the base 10 or may perform the second processing step after changing the temperature of the base 10 within the range in which the temperature difference with respect to the fourth temperature is smaller than or equal to the tolerable temperature "70° C." of the junction layer 20.

As described above, in accordance with the first embodiment, the plasma etching apparatus 100 performs the first processing step of controlling the temperature of the base 10 to the first temperature, controlling the temperature of the electrostatic chuck 9 to the second temperature by the heater 9a provided in the electrostatic chuck 9 that is disposed on the mounting surface of the base 10 so as to mount thereon the object to be processed, and performing the first processing on the object. Further, the plasma etching apparatus 100 performs the second processing step of controlling the temperature of the base 10 to a third temperature, controlling a temperature of the electrostatic chuck 9 to a fourth temperature by the heater 9a, and performing second processing on the object. The difference between the first temperature and the second temperature and the difference between the third temperature and the fourth temperature become the tolerable temperature of the junction layer 20 for bonding the base 10 and the electrostatic chuck 9. As a result, the peeling off of the junction layer 20 can be prevented.

For example, when the heating is performed by the heater 9a of the electrostatic chuck 9, the electrostatic chuck 9 is expanded. Further, the base 10 is contracted by the cooling of the cooling medium by the chiller 70. Here, the junction layer 20 that alleviates stress between expansion and contraction may be provided.

Figure 8:
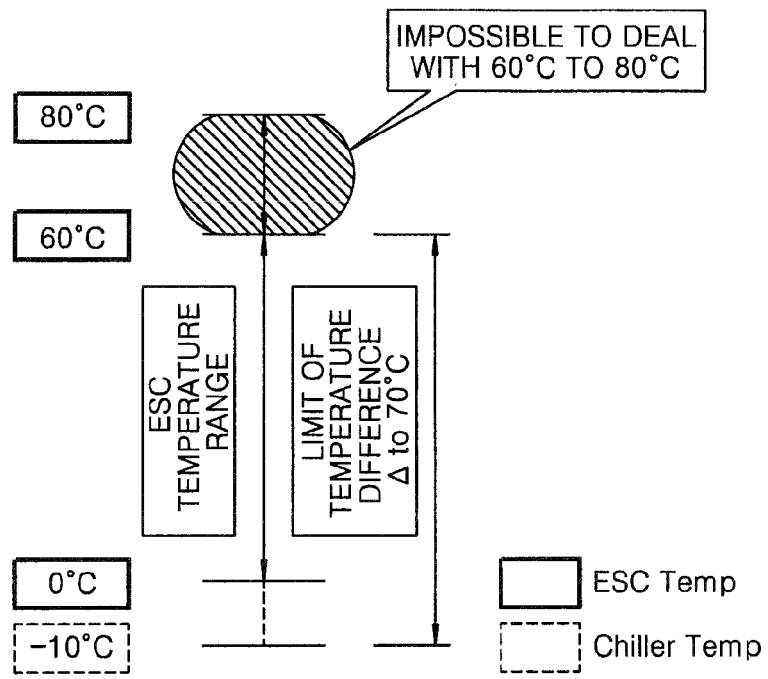
FIG. 8 shows the case of maintaining the temperature of the chiller of the base constant.

In the recent etching process, it is required to extend a temperature control range in a processing step. FIG. 8 shows the case of maintaining the chiller temperature of the base at a constant level. In the example shown in FIG. 8, the case of varying the wafer temperature between "0° C." and "80° C." will be described. Here, as shown in FIG. 8, in a state where the chiller temperature of the base 10 is set to a constant level of about "−10° C.", the temperature of the electrostatic chuck (wafer temperature) in a processing step, which is in combination with the temperature of the heater, is set to "0° C." and the temperature of the electrostatic chuck (wafer temperature) in a certain processing step is set to "80° C.".

As shown in FIG. 8, when the tolerable temperature of the junction layer 20 is "70° C.", if the temperature of the electrostatic chuck 9 becomes higher than 60° C. by the heater 9a, the temperature difference exceeds the tolerable temperature "70° C.".

For example, when the temperature of the electrostatic chuck 9 is set to "80° C." by the heater 9a, the difference between the expansion of the side surface of the electrostatic chuck 9 and the contraction of the base 10 becomes considerably large. As a consequence, the junction layer 20 may be peeled off and the lower electrode may be broken. In other words, in that case, it is not possible to deal with the case in which the processing is performed by heating the temperature of the electrostatic chuck 9 to "60° C." to "80° C." by the heater 9a. The limit of the temperature difference Δ to 70° C. in FIG. 8 indicates the tolerable temperature "70° C.".

Figure 9:
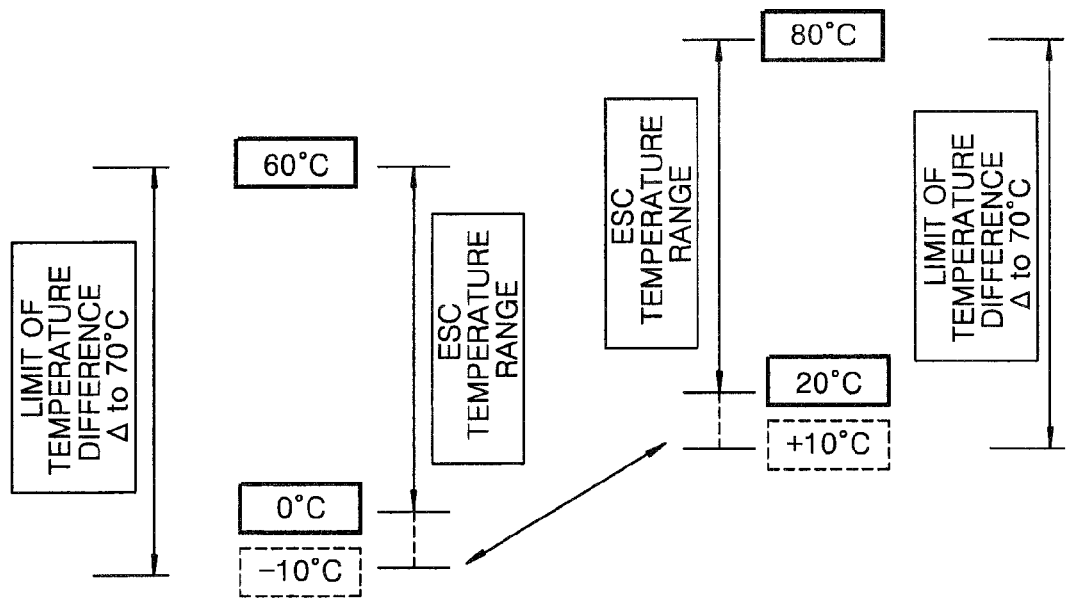
FIG. 9 shows an example of the effect of the first embodiment.

FIG. 9 shows an example of the effect of the first embodiment. As shown in FIG. 9, the process controller 90 of the first embodiment, unlike the case shown in FIG. 8, controls the temperature between processing steps such that the temperature difference between the temperature of the base 10 by the chiller 70 and the temperature of the electrostatic chuck 9 by the heater 9a does not exceed the tolerable temperature of the junction layer 20.

For example, the case shown in FIG. 9 in which the tolerable temperature is set to "70° C." and the etching is performed at "0° C." in a certain processing step and at "80° C." in a next step will be described. In that case, the temperature of the base 10 is controlled to "−10° C." by the chiller temperature, and the temperature of the electrostatic chuck 9 (wafer temperature) is set to "0° C." by the heater 9a. Then, in the next step, the temperature of the electrostatic chuck 9 (wafer temperature) is set to "80° C.". Here, in the case of setting the temperature of the electrostatic chuck 9 (wafer temperature) to "80° C.", if only the temperature of the heater is adjusted, the temperature difference ΔT exceeds 70° C. At this time, the etching can be performed in a state where the temperature difference does not exceed "70° C." by adjusting the temperature of the base 10 to "+10° C." by the chiller 70 and the temperature of the electrostatic chuck 9 (wafer temperature) to "80° C." by controlling the heater temperature. As a result, the peeling off of the junction layer 20 can be prevented. The limit of the temperature difference Δ to 70° C. in FIG. 9 indicates the tolerable temperature "70° C.".

At this time, the chiller 70 has the high temperature control unit 75 and the low temperature control unit 74. The high temperature tank retains the cooling medium having a temperature comparatively higher than that of the cooling medium in the low temperature tank, and the low temperature tank retains the cooling medium having a temperature lower than that of the cooling medium in the high temperature tank. The next process can be rapidly started by changing the temperature of the cooling medium provided by the chiller 70 at a high speed by using both of the cooling medium retained in the high temperature tank and the cooling medium retained in the low temperature tank.

In accordance with the first embodiment, when the temperature difference between the first temperature and the fourth temperature exceeds the tolerable temperature of the junction layer 20, the process controller 90 changes, after the first processing, the first temperature to the third temperature such that the temperature difference between the third temperature and the fourth temperature becomes the tolerable temperature of the junction layer 20. As a result, the temperature difference can be within the tolerable temperature.

Further, in accordance with the first embodiment, the cooling medium circulates in the flow path provided in the base 10 by the chiller 70, and the temperature of the base 10 is controlled by controlling the temperature of the cooling medium. As a result, the peeling off of the junction layer 20 can be prevented by controlling the temperature by the chiller 70.

Other Embodiments

While the plasma etching apparatus and the control method in accordance with the embodiments of the present invention have been described, the present invention is not limited thereto. Hereinafter, other embodiments will be described.

(Temperature of the Chiller)

The process controller 90 performs a step of measuring the temperature of the cooling medium from the base 10. Moreover, the process controller 90 controls, in the changing step, the temperature of the cooling medium to be sent to the inlet of the flow path based on the temperature of the cooling medium from the outlet of the flow path.

Specifically, the process controller 90 measures the temperature of the cooling medium passing through the flow path 72 and controls the temperature of the cooling medium based on the measured temperature. In other words, the temperature of the cooling medium that has been subjected to the temperature control by the chiller 70 and has passed through the base 10 is measured. Further, the process controller 90 performs control such that the measured temperature of the cooling medium becomes the target temperature of the base 10. For example, when the temperature of the base 10 is "10° C.", the control is performed such that the temperature of the cooling medium from the base 10 becomes "10° C.".

Here, it is preferable to measure the temperature of the cooling medium at a portion of the flow path 72 which is close to the base 10. Generally, when the chiller 70 is attached to the outside of the plasma etching apparatus 100, the flow path 72 may have a length of about a few meters to ten and several meters. Therefore, when the temperature of the cooling medium is measured at the portion of the flow path 72 which is close to the base 10, the temperature variation of the cooling medium can be rapidly measured compared to the case of performing measurement at other portions, and the temperature of the cooling medium can be adjusted with high accuracy.

However, the portion for measuring the temperature of the cooling medium is not limited to the portion of the flow path 72 which is close to the base 10, and may be any portion where the temperature of the cooling medium discharged from the base 10 can be measured. For example, it may be any portion of the flow path 72, or the measurement may be carried out inside the chiller 70.

(Sequence of Temperature Adjustment)

Moreover, when the temperature of the electrostatic chuck 9 is increased by the heater 9a, the process controller 90 starts, in the changing step, to change the first temperature to the third temperature before the second temperature is started to be changed to the fourth temperature.

As described above, the junction layer 20 may be peeled off when the temperature difference between the electrostatic chuck 9 and the base 10 exceeds the tolerable temperature. Here, in the case of increasing the temperature of the electrostatic chuck 9 by the heater 9a at a higher speed compared to the speed of increasing the temperature of the base 10 by the chiller 70, if the temperatures of the heater 9a and the chiller 70 are controlled at the same timing, the temperature difference may exceed the tolerable temperature. Therefore, in the case of increasing the temperature of the electrostatic chuck 9 by the heater 9a, the process controller 90 first increases the temperature of the base 10 by increasing the temperature of the cooling medium supplied by the chiller 70, and then starts the heating of the electrostatic chuck 9 by the heater 9a. More specifically, the process controller 90 first increases the temperature of the base 10 by increasing the temperature of the cooling medium supplied by the chiller 70, and then starts the heating of the electrostatic chuck 9 by the heater 9a after the temperature of the base 10 reaches the target temperature.

As a result, when the temperature of the electrostatic chuck 9 is increased by the heater 9a, the temperature difference between the base 10 and the electrostatic chuck 9 is prevented from exceeding the tolerable temperature.

In the same manner, when the temperature of the electrostatic chuck 9 is decreased by the heater 9a, the process controller 90 starts, in the changing step, to change the first temperature to the third temperature after the second temperature is started to be changed to the fourth temperature.

As described above, the junction layer 20 may be peeled off when the temperature difference between the electrostatic chuck 9 and the base 10 exceeds the tolerable temperature. Here, in the case of decreasing the temperature of the electrostatic chuck 9 by the heater 9a at a lower speed compared to the speed of decreasing the temperature of the base 10 by the chiller 70, if the temperatures of the heater 9a and the chiller 70 are controlled at the same timing, the temperature difference may exceed the tolerable temperature. Therefore, when the temperature of the electrostatic chuck 9 is decreased by the heater 9a, the process controller 90 first decreases the temperature of the electrostatic chuck 9 by the heater 9a, and then decreases the temperature of the base 10 by decreasing the temperature of the cooling medium supplied by the chiller 70. More specifically, the process controller first decreases the temperature of the electrostatic chuck 9 to the target temperature by using the heater 9a, and then decreases the temperature of the base 10 by starting to decrease the temperature of the cooling medium supplied by the chiller 70. As a result, when the temperature of the electrostatic chuck 9 is increased by the heater 9a, the temperature difference is prevented from exceeding the tolerable temperature.

(Chiller)

For example, the chiller for controlling the temperature of the base 10 has the low temperature control unit and the high temperature control unit, and the coolant from any one of low temperature control unit and the high temperature control unit may flow in the flow path during the temperature control of the base 10. In other words, any one of the liquid stored in the low temperature control unit and the liquid stored in the high temperature control unit may be supplied, instead of supplying a liquid of a certain temperature which is obtained by mixing the liquid supplied from the low temperature control unit and the liquid supplied from the high temperature unit.

Figure 10:
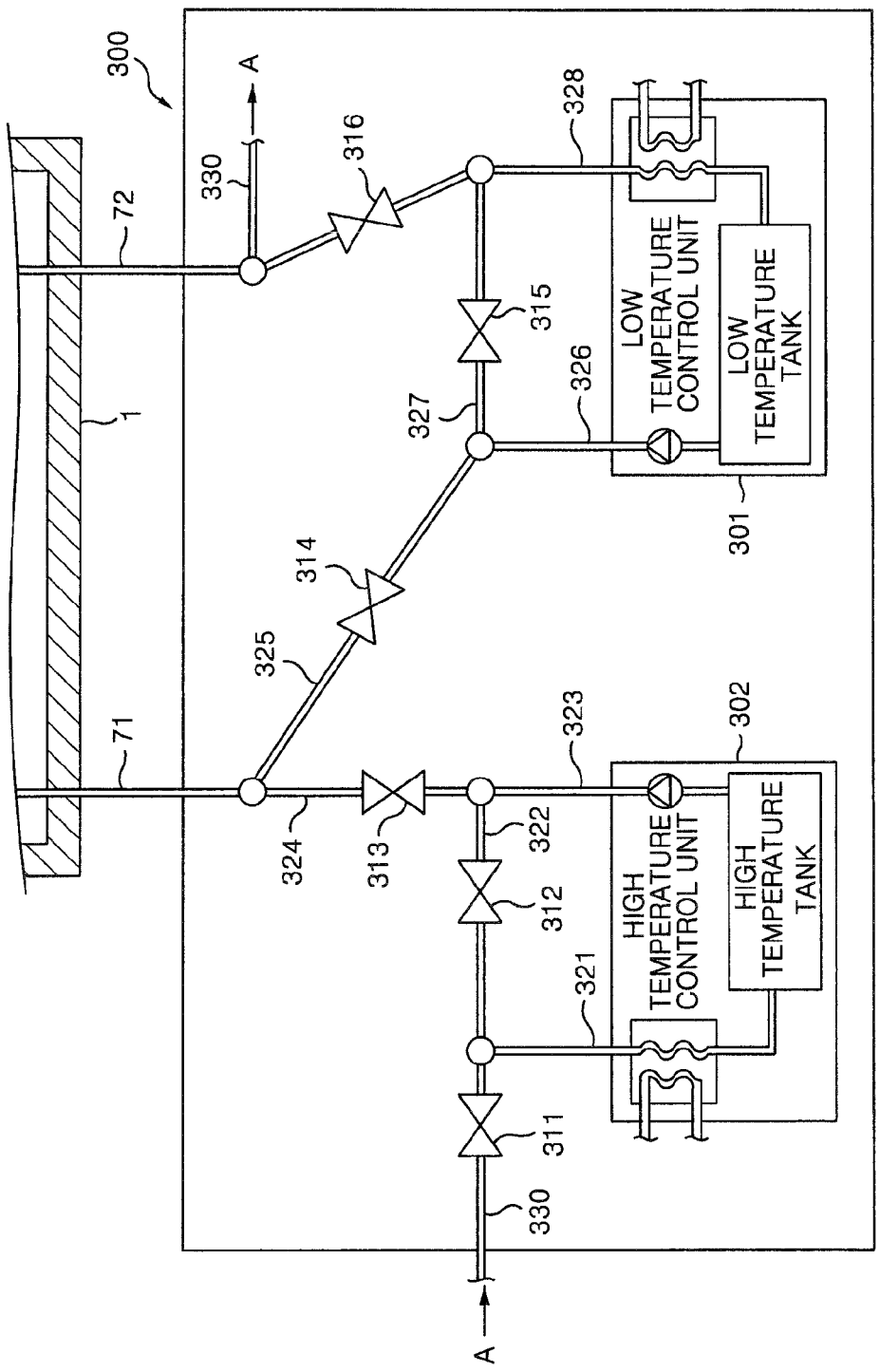
FIG. 10 shows an example of a structure of the chiller for circulating in a flow path a coolant from either a low temperature control unit or a high temperature control unit.

FIG. 10 shows an example of a structure of a chiller for circulating in the flow path the coolant from any one of the low temperature control unit and the high temperature control unit. In the example shown in FIG. 10, a chiller 300 has a low temperature control unit 301 and a high temperature control unit 302. The low temperature control unit 301 and the high temperature control unit 302 correspond to the low temperature control unit 74 and the high temperature control unit 75, respectively. The low temperature control unit 301 stores therein liquid having a temperature ranging from, e.g., −20° C. to −10° C. Further, the high temperature control unit 302 stores therein liquid having a temperature of, e.g., 30° C. However, these temperatures are only examples, and liquid of any temperature may be stored. Moreover, in the example shown in FIG. 10, the chiller 300 has valves 311 to 316 and lines 321 to 330.

In the example shown in FIG. 10, the case of supplying the liquid stored in the low temperature control unit 301 from the chiller 300 will be described. In that case, the valves 311, 313 and 315 can be closed, and the valves 312, 314 and 316 can be opened. As a result, the liquid stored in the low temperature control unit 301 is supplied from the low temperature control unit 301 to the flow path 71 through the lines 326 and 325. Further, the liquid discharged from the flow path 72 returns to the low temperature control unit 301 through the lines 329 and 328. In this manner, the liquid stored in the low temperature control unit 301 is supplied to the base 10 and circulates therein. At this time, the liquid stored in the high temperature control unit 302 circulates in the lines 321 to 323 without being supplied to the base 10.

In the example shown in FIG. 10, the case of supplying the liquid stored in the high temperature control unit 302 from the chiller 300 will be described. In that case, the valves 312, 314 and 316 can be closed and the valves 311, 313 and 315 can be opened. As a result, the liquid stored in the high temperature control unit 302 is supplied to the flow path 71 through the lines 323 and 324. Further, the liquid from the flow path 72 returns to the high temperature control unit 302 through the lines 330 and 321. In this manner, the liquid stored in the high temperature control unit 302 is supplied to the base 10 and circulates therein. At this time, the liquid stored in the low temperature control unit 301 circulates in the lines 326 to 328 without being supplied to the base 10.

Although the case in which the valves 311 to 316 are installed in the chiller 300 has been described as an example in FIG. 10, the valves 311 to 316 may be provided outside the chiller 300 without being limited to the above example.

Figure 11:
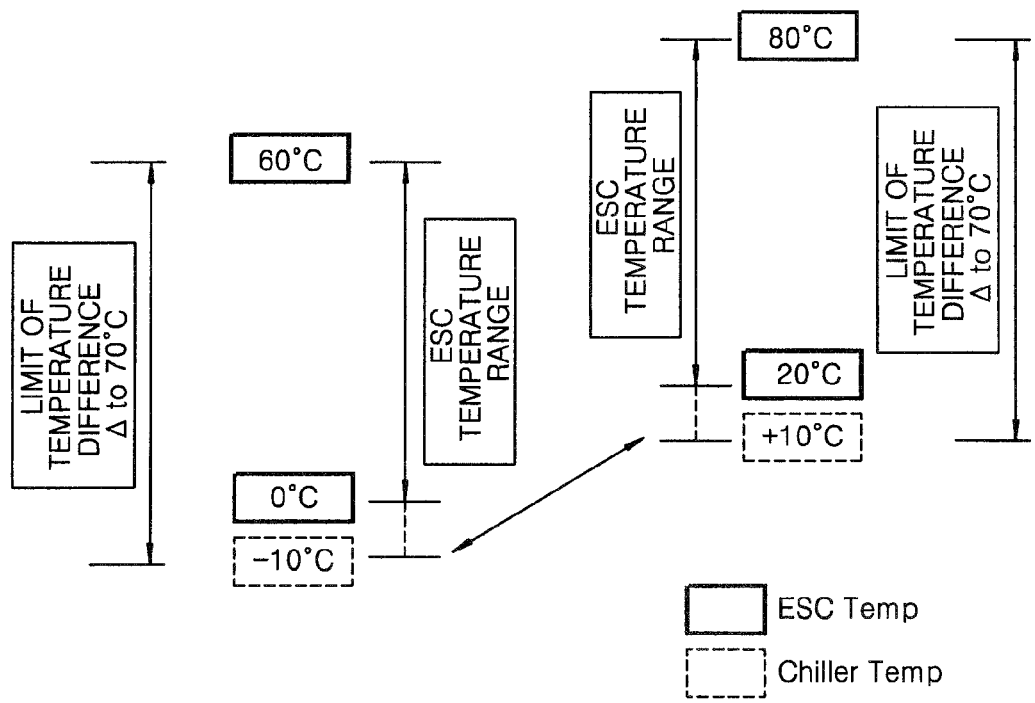
FIG. 11 shows the effect obtained in the case of circulating in the flow path the coolant from either the low temperature control unit or the high temperature control unit.

FIG. 11 shows the effect obtained when the coolant from any one of the low temperature control unit or the high temperature control unit flows in the flow path. The case shown in FIG. 11 in which the tolerable temperature is "70° C." and the etching is performed at "0° C." in a certain process step and at "80° C." in a next step will be described. In that case, the temperature of the base is controlled to "−10° C." by the chiller temperature and the temperature of the electrostatic chuck 9 (wafer temperature) is set to "0° C." by the heater 9a. Then, in the next step, the temperature of the electrostatic chuck 9 (wafer temperature) is set to "80° C.". Here, in the case of setting the temperature of the electrostatic chuck 9 (wafer temperature) to "80° C.", if only the temperature of the heater is adjusted, the temperature difference ΔT exceeds 70° C. Therefore, the etching can be performed in a state where the temperature difference does not exceed "70° C." by adjusting the temperature of the base 10 to "+30° C." by the chiller 70 and the temperature of the electrostatic chuck 9 (wafer temperature) to "80° C." by adjusting the heater temperature. As a result, the peeling off of the junction layer 20 can be prevented. The limit of the temperature difference Δ to 70° C. in FIG. 11 indicates the tolerable temperature "70° C.".

As described above, the chiller for controlling the temperature of the base 10 has the low temperature control unit and the high temperature control unit, and the structure of the chiller can be simplified by circulating in the flow path the coolant from any one of the low temperature control unit and the high temperature control unit during the temperature control of the base 10a, which can realize space saving at a low cost. For example, the variable valve is not required, so that the cost reduction can be achieved.

(Circulation of Liquid from the Chiller)

For example, the above embodiment has described an example in which the temperature of the liquid supplied from the chiller is changed. However, the present invention is not limited thereto. For example, when the temperature difference between the temperature of the liquid supplied by the chiller and the heater temperature exceeds the tolerable temperature of the junction layer 20, the liquid supplied from the chiller may not circulate in the base 10. In that case, the cooling by the chiller is not performed, and the temperature of the base 10 or the temperature of the liquid remaining in the line provided in the base 10 is increased by the heat of the heater. As a result, the temperature difference can be prevented from exceeding the tolerable temperature of the junction layer 20.

Specifically, when the difference between the first temperature and the fourth temperature exceeds the tolerable temperature of the junction layer 20, the first temperature is changed to the third temperature, after the first processing, so that the temperature difference with respect to the fourth temperature becomes the tolerable temperature of the junction layer 20. At this time, the step of stopping the circulation of the coolant in the base 10 is carried out.

Figure 12:
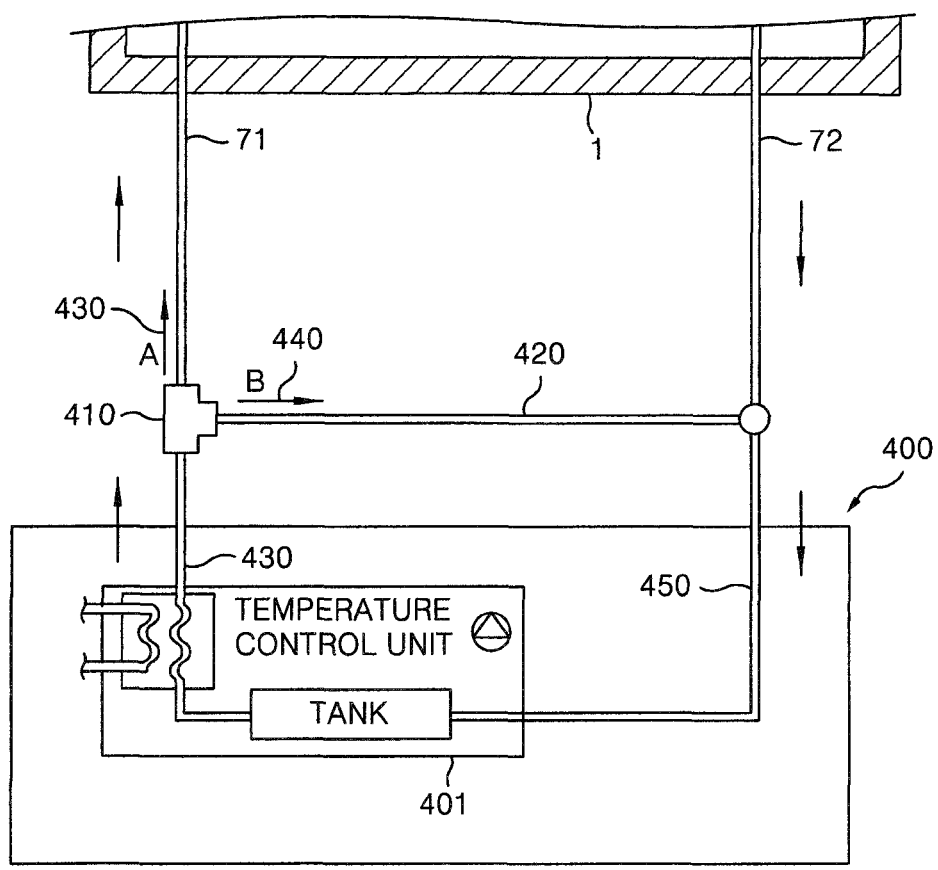
FIG. 12 shows an example of a structure of the chiller for stopping circulation of a coolant in the base.

FIG. 12 shows an example of a structure of the chiller for stopping circulation of the coolant in the base 10. In the example shown in FIG. 12, a chiller 400 has a three-way valve 410. Here, when the temperature difference is within the tolerable range despite that the liquid is supplied by the temperature control unit 401, the direction of the three-way valve 410 is set as indicated by an arrow 430. In that case, the liquid supplied from the chiller 400 is supplied to the flow path 71 through the line 430 and the three-way valve 410, and the liquid output from the flow path 72 is supplied to the chiller 400 through a line 450. Accordingly, the coolant circulates in the base 10.

Further, when the temperature difference exceeds the tolerable range despite that the liquid is supplied by the temperature control unit 401, the direction of the three-way valve 410 is set as indicated by an arrow 440. In that case, the liquid supplied from the chiller 400 circulates in the lines 430, 420 and 450 without circulating in the base 10.

The example of FIG. 12 shows the case of using the three-way valve. However, the present invention is not limited thereto. Further, the example of FIG. 12 shows the case in which the chiller 400 has a single temperature control unit 401. However, the present invention is not limited thereto. For example, the chiller 400 may have a low temperature control unit and a high temperature control unit. In that case, the step of stopping the circulation of the coolant in the base 10 is performed when the temperature of the liquid supplied by, e.g., the low temperature control unit, exceeds the tolerable temperature of the junction layer 20.

As described above, when the difference between the first temperature and the fourth temperature exceeds the tolerable temperature of the junction layer 20, the first temperature is changed to the third temperature, after the first processing, so that the temperature difference with respect to the fourth temperature becomes the tolerable temperature of the junction layer 20. At this time, the step of stopping the circulation of the coolant in the base 10 is carried out. Accordingly, the temperature difference can be prevented from exceeding the tolerable temperature of the junction layer 20.

Further, when the step of stopping the circulation of the coolant in the base 10 is performed, the heat radiation performance of the base 10 can be improved by further installing a cooling mechanism having a different system from the chiller. For example, the heat radiation performance of the base 10 may be improved by additionally providing a mechanism for air-cooling the base 10 or by installing a heat radiator around the base 10.

What is claimed is:

1. A control method comprising:
   a first processing step of controlling a temperature of a base to a first temperature, controlling a temperature of an electrostatic chuck that is disposed on the base so as to mount thereon an object to be processed and has a heater installed therein to a second temperature, and performing first processing on the object; and
   a second processing step of controlling a temperature of the base to a third temperature, controlling a temperature of the electrostatic chuck to a fourth temperature by a heater, and performing second processing on the object,
   wherein a difference between the first temperature and the second temperature and a difference between the third temperature and the fourth temperature are within a tolerable temperature of the junction layer for bonding the base and the electrostatic chuck.

2. The control method of claim 1, further comprising, after the first processing step, a changing step of changing, when a difference between the first temperature and the fourth temperature exceeds the tolerable temperature of the junction layer, the first temperature to the third temperature so that the temperature difference with respect to the fourth temperature becomes within the tolerable temperature range of the junction layer.

3. The control method of claim 1, wherein a cooling medium circulates in a flow path disposed in the base by a chiller, and the temperature of the base is controlled by controlling the temperature of the cooling medium.

4. The control method of claim 3, wherein the cooling medium circulates in the flow path disposed in the base by the chiller; the chiller circulates the cooling medium by sending the cooling medium to an inlet of the flow path disposed in the base, receiving the cooling medium output from an outlet of the flow path, controlling the temperature of the cooling medium, and then sending the cooling medium to the flow path; and in the changing step, the temperature of the cooling medium output from the outlet of the flow path is measured and the temperature of the cooling medium to be sent to the inlet of the flow path is controlled based on the measured temperature of the cooling medium.

5. The control method of claim 1, wherein in the case of increasing the temperature of the electrostatic chuck by the heater, in the changing step, the first temperature is changed to the third temperature before the second temperature is started to be increased to the fourth temperature.

6. The control method of claim 1, wherein in the case of decreasing the temperature of the electrostatic chuck by the heater, in the changing step, the first temperature is changed to the third temperature after the second temperature is started to be decreased to the fourth temperature.

7. The control method of claim 3, wherein the chiller for controlling the temperature of the base has a low temperature control unit and a high temperature control unit, and a coolant from any one of the low temperature control unit and the high temperature control unit is made to flow in the flow path during the temperature control of the base.

8. The control method of claim 3, further comprising a step of stopping the circulation of the coolant in the base in a changing step of changing the first temperature to the third temperature, after the first processing, so that the temperature difference with respect to the fourth temperature becomes within the tolerable temperature range of the junction layer when the difference between the first temperature and the fourth temperature exceeds the tolerable temperature of the junction layer.

9. A plasma etching apparatus comprising:
a base;
an electrostatic chuck disposed on the base and configured to mount thereon an object to be processed;
a junction layer bonding the base and the electrostatic chuck;
a heater provided in the electrostatic chuck;
a chiller configured to control a temperature of the base; and
a control unit configured to control, when first processing is performed on the object, a temperature of the base to a first temperature and a temperature of the electrostatic chuck to a second temperature, and control, when second processing is performed on the object, a temperature of the base to a third temperature and a temperature of the electrostatic chuck to a fourth temperature by the heater,
wherein a temperature difference between the first temperature and the second temperature and a temperature difference between the third temperature and the fourth temperature are within a tolerable temperature of the junction layer.

10. The plasma etching apparatus of claim 9, wherein, when the temperature between the first temperature and the fourth temperature exceeds the tolerable temperature of the junction layer, the control unit changes, after the first processing, the first temperature to the third temperature so that the temperature difference with respect to the fourth temperature becomes within the tolerable temperature of the junction layer.

11. The plasma etching apparatus of claim 9, wherein a cooling medium circulates in the flow path provided in a base by the chiller, and the temperature of the base is controlled by controlling the temperature of the cooling medium.

12. The plasma etching apparatus of claim 9, wherein a cooling medium circulates in the flow path disposed in a base by the chiller;
the chiller circulates the cooling medium by sending the cooling medium to an inlet of the flow path disposed in the base, receiving the cooling medium output from an outlet of the flow path, controlling the temperature of the cooling medium, and then sending the cooling medium to the flow path;
the plasma etching apparatus further comprises a measurement unit configured to measure the temperature of the cooling medium output from the outlet of the flow path; and
the control unit controls the temperature of the cooling medium to be sent to the inlet of the flow path based on the temperature of the cooling medium which is measured by the measurement unit.

13. The plasma etching apparatus of claim 9, wherein in the case of increasing the temperature of the electrostatic chuck by the heater, the control unit changes the first temperature to the third temperature before the second temperature is started to be increased to the fourth temperature.

14. The plasma etching apparatus of claim 9, wherein, in the case of decreasing the temperature of the electrostatic chuck by the heater, the control unit changes the first temperature to the third temperature before the second temperature is started to be decreased to the fourth temperature.

15. The plasma etching apparatus of claim 9, wherein the chiller for controlling the temperature of the base has a low temperature control unit and a high temperature control unit, and a coolant from any one of the low temperature control unit or the high temperature control unit is made to flow in the flow path during the temperature control of the base.

16. The control method of claim 9, wherein the control unit stops circulation of a coolant in the base, in case of changing the first temperature to the third temperature, after the first processing, so that the temperature difference with respect to the fourth temperature becomes within the tolerable temperature of the junction layer when the difference between the first temperature and the fourth temperature exceeds the tolerable temperature of the junction layer.

* * * * *

UNITED STATES PATENT AND TRADEMARK OFFICE
CERTIFICATE OF CORRECTION

| | |
|---|---|
| PATENT NO. | : 8,809,197 B2 |
| APPLICATION NO. | : 14/013128 |
| DATED | : August 19, 2014 |
| INVENTOR(S) | : Atsuhiko Tabuchi |

Page 1 of 1

It is certified that error appears in the above-identified patent and that said Letters Patent is hereby corrected as shown below:

On the title page of the patent, item (30) Foreign Application Priority Data, add
-- Feb. 20, 2013 (JP) .......... 2013-031212 --

Signed and Sealed this
Twenty-fourth Day of February, 2015

Michelle K. Lee
*Deputy Director of the United States Patent and Trademark Office*